United States Patent
Nardi et al.

(10) Patent No.: US 9,178,000 B1
(45) Date of Patent: Nov. 3, 2015

(54) RESISTIVE RANDOM ACCESS MEMORY CELLS HAVING SHARED ELECTRODES WITH TRANSISTOR DEVICES

(71) Applicants: Intermolecular Inc., San Jose, CA (US); Kabushiki Kaisha Toshiba, Tokyo (JP); SanDisk 3D LLC, Milpitas, CA (US)

(72) Inventors: Federico Nardi, Palo Alto, CA (US); Ryan C. Clarke, San Jose, CA (US); Tim Minvielle, San Jose, CA (US); Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/264,280

(22) Filed: Apr. 29, 2014

(51) Int. Cl.
| | |
|---|---|
| H01L 29/02 | (2006.01) |
| H01L 29/792 | (2006.01) |
| H01L 27/11 | (2006.01) |
| H01L 21/00 | (2006.01) |
| H01L 27/24 | (2006.01) |
| H01L 45/00 | (2006.01) |
| H01L 29/08 | (2006.01) |
| H01L 21/265 | (2006.01) |
| H01L 21/02 | (2006.01) |

(52) U.S. Cl.
CPC ...... *H01L 27/2463* (2013.01); *H01L 21/02532* (2013.01); *H01L 21/02595* (2013.01); *H01L 21/265* (2013.01); *H01L 27/2436* (2013.01); *H01L 29/0847* (2013.01); *H01L 45/1233* (2013.01); *H01L 45/1253* (2013.01); *H01L 45/146* (2013.01); *H01L 45/1608* (2013.01)

(58) Field of Classification Search
CPC ..... H01L 45/085; H01L 45/04; H01L 29/685; H01L 27/24; H01L 45/1233; H01L 45/08; H01L 27/2454; H01L 27/2418; H01L 27/2436; H01L 45/1675; H01L 45/1266; H01L 45/1616; G11C 13/0011
USPC ............ 257/2, 4, 324, E21.52, E45.003, 379, 257/E27.081; 438/104, 238, 382, 17, 128
See application file for complete search history.

(56) References Cited

U.S. PATENT DOCUMENTS

| | | | |
|---|---|---|---|
| 7,539,039 B2 | 5/2009 | Schwerin | |
| 2004/0100814 A1* | 5/2004 | Hsu | 365/148 |
| 2005/0121743 A1* | 6/2005 | Herner | 257/530 |
| 2008/0090337 A1* | 4/2008 | Williams | 438/133 |
| 2010/0080037 A1* | 4/2010 | Inoue et al. | 365/148 |
| 2010/0109085 A1* | 5/2010 | Kim et al. | 257/364 |
| 2010/0219392 A1 | 9/2010 | Awaya | |

\* cited by examiner

*Primary Examiner* — Ha Tran T Nguyen
*Assistant Examiner* — Dzung Tran

(57) ABSTRACT

Provided are resistive random access memory (ReRAM) cells having extended conductive layers operable as electrodes of other devices, and methods of fabricating such cells and other devices. A conductive layer of a ReRAM cell extends beyond the cell boundary defined by the variable resistance layer. The extended portion may be used a source or drain region of a FET that may control an electrical current through the cell or other devices. The extended conductive layer may be also operable as electrode of another resistive-switching cell or a different device. The extended conductive layer may be formed from doped silicon. The variable resistance layer of the ReRAM cell may be positioned on the same level as a gate dielectric layer of the FET. The variable resistance layer and the gate dielectric layer may have the same thickness and share common materials, though they may be differently doped.

18 Claims, 4 Drawing Sheets

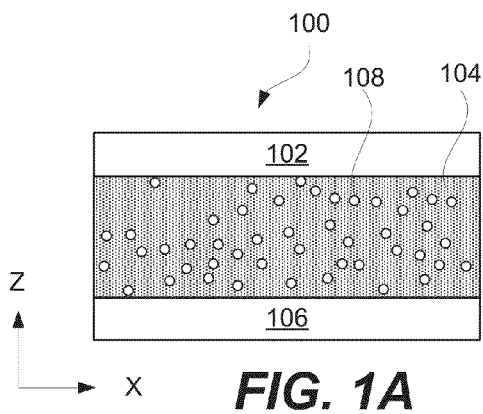
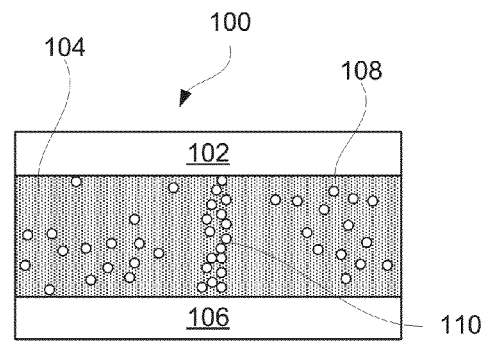
FIG. 1A   FIG. 1B
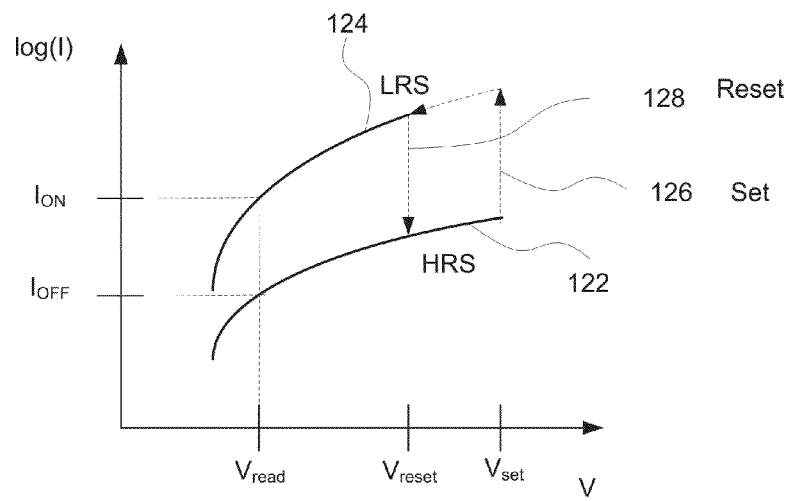
FIG. 2

RESISTIVE RANDOM ACCESS MEMORY CELLS HAVING SHARED ELECTRODES WITH TRANSISTOR DEVICES

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells having extended conductive layers operable as electrodes of ReRAM cells and, at the same time, an electrode of additional devices, such as field effect transistors, pinched resistors, bipolar junction transistors, junction gate field-effect transistors, silicon on insulator devices, fully depleted silicon on insulator devices, self-aligned double-gate MOSFET (FinFET) devices, diodes, or additional resistive-switching cells. In some embodiments, a conductive layer is operable as an electrode of two or more resistive-switching cells (which, as well as memory, may be implemented as logic or for any other suitable application of two-state switches) and as a source or a drain region of one or more field effect transistor (FETs). Also provided are methods of fabricating such cells. Specifically, an extended conductive layer operable as an electrode of one ReRAM cell protrudes beyond the boundary of the cell defined by its variable resistance layer. The extended portion is used as a FET source region or a drain region. In some embodiments, the FET may be configured to control an electrical current through this and other devices. The extended conductive layer may be formed from doped silicon or, more specifically, from n+ doped polysilicon or p+ doped polysilicon. The variable resistance layer of the ReRAM cell may be positioned on the same level as a gate dielectric layer of the FET. In some embodiments, the variable resistance layer and the gate dielectric layer have the same thickness.

In some embodiments, a ReRAM cell includes a first conductive layer, a second conductive layer, and a variable resistance layer. The first conductive layer and the second conductive layer are operable as electrodes of the ReRAM cell. The first conductive layer may be referred to as a first electrode or a bottom electrode. The second conductive layer may be referred to as a second electrode or a top electrode. The variable resistance layer is disposed between the first conductive layer and the second conductive layer. The first conductive layer includes doped silicon and is operable as an electrode of at least one other device, such as another ReRAM cell. Specifically, two or more ReRAM cells may share the same first conductive layer. In some embodiments, the width of the variable resistance layer is less than or equal to $\frac{1}{10}$ of the width of the first conductive layer. The first conductive layer is also operable as an electrode of two or more other devices. Some examples of such devices include a pinched resistor, a bipolar junction transistor, a junction gate field-effect transistor, a silicon on insulator device, a fully depleted silicon on insulator device, a self-aligned double-gate MOSFET (FinFET) device, a diode, or an additional resistive-switching cell. In a specific example, one of the additional devices is a FET. The first conductive layer may be operable as a source region or a drain region of this FET. This FET may be configured to control the flow of the electrical current through a ReRAM cell and another device (e.g., through multiple ReRAM cells) that share the first conductive layer as their bottom electrodes.

In some embodiments, the first conductive layer includes n+ doped silicon. Alternatively, the first conductive layer includes p+ doped silicon. In some embodiments, the ReRAM cell also includes a signal line, such that the second conductive layer is disposed between the signal line and the variable resistance layer. The conductivity of the first conductive layer may be less than about one-third of the conductivity of the signal line. The first conductive layer may be different from the signal line, or insufficiently conductive to be used as the signal line, in some embodiments. The first conductive layer and the signal line may extend substantially parallel to each other. In some embodiments, the first conductive layer and the signal line extend substantially perpendicular to each other.

The thickness of the variable resistance layer may be substantially the same as a thickness of the gate dielectric layer of the FET. However, the composition of the variable resistance layer may differ from the composition of the gate dielectric layer of the FET. In some embodiments, both layers may have the same base material but have different dopants or other materials added to this base material. In some embodiments, the second conductive layer of the ReRAM cell and the gate conductive layer of the FET have the same thickness. Furthermore, the second conductive layer of the ReRAM cell and the gate conductive layer of the FET may have the same composition. For example, both layers may be formed from titanium nitride.

In some embodiments, the ReRAM cell also includes a barrier layer disposed between the first conductive layer and the variable resistance layer. The barrier layer may be used to prevent migration of materials between the first conductive layer and the variable resistance layer. A similar barrier layer may be disposed between the gate dielectric of the FET and the conductive layer. In some embodiments, the ReRAM cell also includes an interface layer disposed between the first conductive layer and the variable resistance layer. The interface layer may be formed from a silicon oxide.

In some embodiments, the variable resistance layer may be formed from one of $HfO_2$, $Ta_2O_5$, or $Al_2O_3$, $Y_2O_3$, $ZrO_2$, or non-stoichiometric compositions thereof. The second conductive layer may be formed from titanium nitride or other suitable conductive material. The first conductive layer may directly interface the variable resistance layer. The second conductive layer may directly interface the variable resistance layer.

In some embodiments, a ReRAM cell includes a first conductive layer formed from titanium nitride, a second conductive layer formed from n+ doped polysilicon, and a variable resistance layer formed from one of $HfO_2$, $Ta_2O_5$, or $Al_2O_3$, $Y_2O_3$, $ZrO_2$, or non-stoichiometric compositions thereof. The first conductive layer and the second conductive layer are operable as electrodes. The variable resistance layer is disposed between the first conductive layer and the second conductive layer. The first conductive layer may be operable as a conductive layer of at least one other device, e.g., another ReRAM cell. The first conductive layer may be operable as a drain region of a FET configured to control a flow of an electrical current through the ReRAM cell and the other device(s).

Also provided is a method of fabricating a ReRAM cell. The method may involve providing a polysilicon structure and doping a portion of the polysilicon structure with an n-type dopant. The doping may be performed using ion implantation. The method may proceed with forming a variable resistance layer on the doped portion of the polysilicon structure. The doped portion of the polysilicon structure extends beyond the variable resistance layer. The doped portion is operable as a first electrode of the ReRAM cell and as an electrode of at least another device. The doped portion is operable as a source region or a drain region of a FET configured to control a flow of an electrical current through the ReRAM cell and the at least one other device. The method proceeds with forming a conductive layer over the variable resistance layer. The conductive layer is operable as a second electrode.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIGS. 1A and 1B illustrate schematic representations of a ReRAM cell in its high resistive state (HRS) and low resistive state (LRS), in accordance with some embodiments.

FIG. 2 illustrates a plot of a current passing through a ReRAM cell as a function of a voltage applied to the ReRAM cell, in accordance with some embodiments.

DETAILED DESCRIPTION

Figure 3:
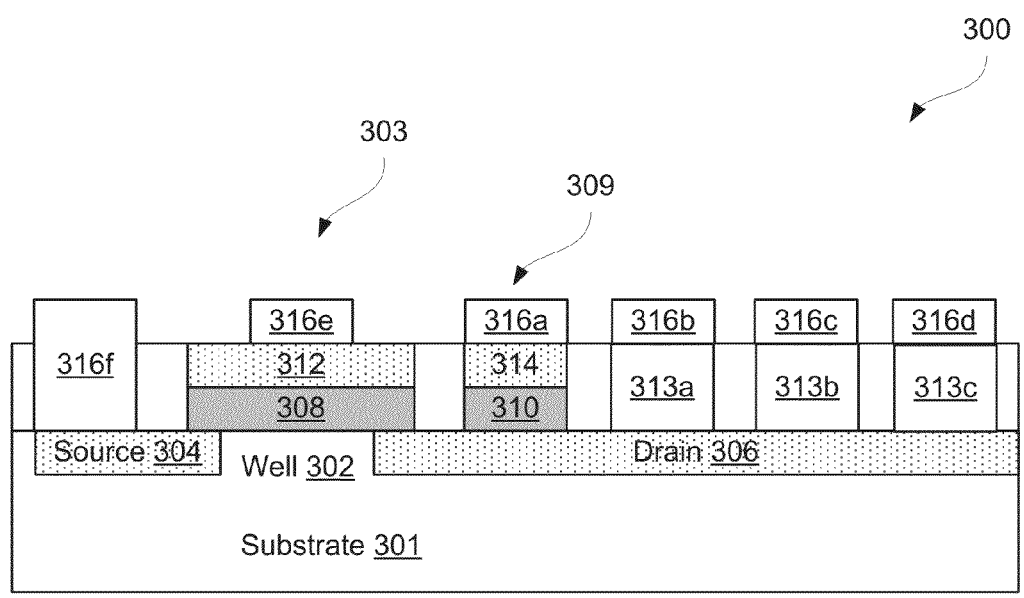
FIG. 3 illustrates a schematic representation of an assembly including a ReRAM cell and three other devices and one FET, in which the drain region of the FET also functions as the bottom electrodes of the ReRAM cell and the other devices, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack. The stack includes two conductive layers operating as electrodes. These layers may be formed from metals or other conductive materials, such as polysilicon or metal nitrides. The stack also includes an insulator layer disposed between the two electrodes and configured to change its resistive properties when switching voltages are applied to this insulator layer. This layer may be referred to as a variable resistance layer or a resistive switching layer. The changeable resistive properties are used to store data. For example, one resistive state may be associated with a logic "zero", while the other resistive state may be associated with a logic "one" value.

A transistor, such as a FET, is typically coupled to each individual ReRAM cell to limit the electrical current through the cell thereby preventing over-programming. This current limiting functionality may be also used as a selector and, for example, to prevent the current from flowing through the cell when reading or switching other ReRAM cells sharing the same signal lines. An assembly in which one transistor is assigned to control only one ReRAM cell may be referred to a 1T1R assembly. However, this type of assembly is intrinsically not scalable. While ReRAM cells can be made very small, the transistor scalability is lacking. Furthermore, interconnection formed between a transistor and a ReRAM cell tends to be bulky (at least bigger than the boundary of the variable resistance layer of a ReRAM cell). As, such these interconnects may define the active area or, more specifically, the switching area of the ReRAM device. These interconnects may be also difficult to scale down. Furthermore, these interconnects can cause parasitic series resistance due to the presence of interfacial layers.

Provided are ReRAM cells having extended conductive layers operable as electrodes of other devices, such as FETs. As such, one structure is used as a shared electrode by multiple devices, such as a ReRAM cell and, for example, a pinched resistor, a bipolar junction transistor, a junction gate field-effect transistor, a silicon on insulator device, a fully depleted silicon on insulator device, a self-aligned double-gate MOSFET (FinFET) device, a diode, or an additional resistive-switching cell. This shared operability of the same component allows substantially increasing the component density in comparison to the 1T1R approach described above. This component sharing not only results in component density improvements but also simplifies fabrication techniques.

Forming of ReRAM components can be done in parallel, to a certain extent, with forming FET components or components or other devices. Moreover, various problems related to interconnects, which are briefly mentioned above, are addressed.
Examples of ReRAM Cells and their Switching Mechanisms A brief description of ReRAM cells is provided for better understanding of various features of variable resistance layers, as described in this document. A ReRAM cell includes a variable resistance layer formed from a dielectric material exhibiting resistive switching characteristics. A dielectric, which is normally insulating, can be made more conductive when one or more filaments or conduction paths are formed through the layer. The filaments can be formed based on different mechanisms, such as defect migration with the layer when a voltage is applied to the layer. Once the filaments are initially formed, these filaments may be then at least partially broken and reformed by applying switching voltages.

FIG. 1A illustrates a schematic representation of ReRAM cell 100 including top electrode 102, bottom electrode 106, and variable resistance layer 104 disposed between top electrode 102 and bottom electrode 106. It should be noted that the "top" and "bottom" references are used solely for differentiation and not to imply any particular spatial orientation of the components. Other references, such as "first" and "second", may be also used identify and distinguish similar components, such as two electrodes, or similar features of the same component, such as two sides of the variable resistance layer.

Variable resistance layer 104 may be initially formed from a dielectric material, such as transition metal oxides and other like materials. Variable resistance layer 104 may be then made to conduct through one or more filaments formed within variable resistance layer 104 by applying a forming voltage or, more specifically, a set of forming pulses. To provide this resistive switching functionality, variable resistance layer 104 may some electrically active defects 108. Electrically active defects 108 may be charge carriers absent from the structure (i.e., vacancies) and/or additional charge carriers introduces into the base material. In some embodiments, electrically active defects 108 may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sub-lattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Without being restricted to any particular theory, it is believed that defects 108 can be reoriented within variable resistance layer 104 to form filaments as, for example, schematically shown in FIG. 1B as element 110. This reorientation of defects 108 occurs when a set voltage or a forming voltage is applied to electrodes 102 and 106. Sometimes, reorientation of defects 108 is referred to as "filling the traps" when a set voltage is applied (to form one or more filaments or conduction paths) and "emptying the traps" when a reset voltage is applied (to break the previously formed filaments or conduction paths).

Defects 108 can be introduced into variable resistance layer 104 during or after its fabrication. For example, a concentration of oxygen deficiencies can be introduced into metal oxides during their deposition or during subsequent annealing. Operation of ReRAM cell 100 will now be briefly described with reference to FIG. 2, which illustrates a logarithmic plot of a current passing through a unipolar ReRAM cell as a function of a voltage applied between the electrodes of the ReRAM cell, in accordance with some embodiments. Similar characteristics are demonstrated by bipolar cells, additional details of which are further presented below. ReRAM cell 100 may be either in a low resistive state (LRS) defined by line 124 or high resistive state (HRS) defined by line 122. Each of these resistive states is used to store a different logic state, e.g., HRS may be read as logic "one" and LRS may be read as logic "zero," or vice versa. Therefore, each ReRAM cell that has two resistive states may be used to store one bit of data. It should be noted that some ReRAM cells may have three and even more resistive states allowing multi-bit storage in the same cell.

HRS and LRS correspond to the presence or absence of one or more filaments or conductive paths in variable resistance layer 104 and of connections between these filaments or conduction paths and the two electrodes 102 and 106. For example, a ReRAM cell may be initially fabricated in LRS and then switched to HRS, or vice versa. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). Set and reset operations may be referred to as write operations. During the read operation, the state of ReRAM cell 100 (more specifically, the resistive state of variable resistance layer 104) can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in variable resistance layer 104 and switches ReRAM cell 100 from its HRS to LRS as indicated by arrow 126. It should be noted that formation or breaking of filaments or conduction paths in variable resistance layer 104 may also involve forming or breaking electrical connections between these filaments and one or both electrodes. The common factor in all these switching mechanisms is passage or blockage of current between the two electrodes.

In LRS, the resistive characteristics of ReRAM cell 100 are represented by line 124. In this LRS, when the read voltage ($V_{READ}$) is applied between electrodes 102 and 106, the external read and write circuitry will sense the resulting "ON"

current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation, as distinct from the set operation during which ReRAM cell 100 is switched from its HRS to LRS. During the reset operation, a reset voltage ($V_{RESET}$) is applied to ReRAM cell 100 to break the previously formed filaments or conduction paths in variable resistance layer 104, switching ReRAM cell 100 from its LRS to HRS as indicated by arrow 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that, without being bound by theory, are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to variable resistance layer 104. In the bipolar switching, the set voltage ($V_{SET}$) and reset voltage ($V_{RESET}$) applied to variable resistance layer 104 need to have different polarities.

In some embodiments, the set voltage ($V_{SET}$) is between about 100 mV and 10V or, in some embodiments, between about 500 mV and 5V. The length of set voltage pulses ($t_{SET}$) may be less than about 100 milliseconds, less than about 5 milliseconds, or even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, in some embodiments, greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., an $I_{SET}/I_{RESET}$ ratio) that corresponds to a set voltage ($V_{SET}$) and reset voltage ($V_{RESET}$) may be at least about 5 or, in some embodiments, at least about 10 to make the state of ReRAM cell easier to determine. ReRAM cells should be able to cycle between LRS and HRS at least about $10^3$ times or, in some embodiments, at least about $10^7$ times without failure. A data retention time (tRET) should be at least about 5 years or, in some embodiments, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

In some embodiments, the same ReRAM cell may include two or more variable resistance layers interconnected in series. Pairs of variable resistance layers may directly contact each other, or they may be separated by one or more intermediate layers.

In some embodiments, a ReRAM cell is subjected to a forming operation, during which the initially insulating properties of the variable resistance layer are altered and the ReRAM cell is configured into the initial LRS or HRS. The forming operation may include a very short high discharge current peak associated with a forming voltage. The LRS level of the variable resistance layer for subsequent switching is determined by the filaments or connections created by the forming operation. If the forming operation makes the resistive-switching layer too conductive, the cell may be difficult to reset. In this case, a variable resistance layer with very low levels of resistance in the LRS may be limited in terms of scaling down. This difficulty may be resolved by positioning such variable resistance layers in series with other components providing additional resistance to the overall ReRAM cell.

Examples of Assemblies Including ReRAM Cells and FETs

FIG. 3 illustrates a schematic representation of an assembly 300 that includes a ReRAM cell 309 and three devices 313a-313c and one FET 303, in accordance with some embodiments. While FET 303 is shown as an example, one having ordinary skills in the art would understand that other types of devices may be used, such as a pinched resistor, a bipolar junction transistor, a junction gate field-effect transistor, a silicon on insulator device, a fully depleted silicon on insulator device, a self-aligned double-gate MOSFET (FinFET) device, a diode, or an additional resistive-switching cell.

Figure 4:
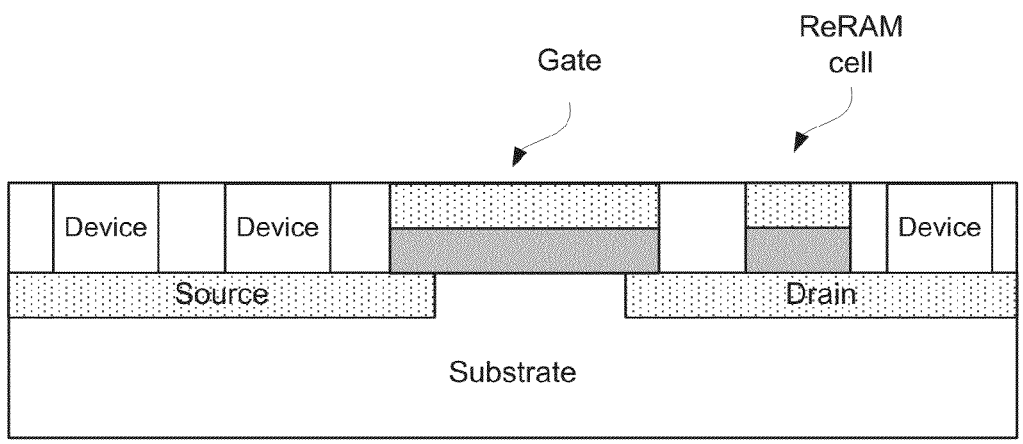
FIG. 4 illustrates a schematic representation of an assembly including a ReRAM cell and three other devices as well as one FET, in which the drain region of the FET functions as the bottom electrodes of the ReRAM cell and one of the devices and the source region of the FET functions as the bottom electrode of the two other devices, in accordance with some embodiments.

ReRAM cell 309, three devices 313a-313c, and one FET 303 are disposed on the same substrate 301. FET 303 includes a source region 304 and a drain region 306 as well as a gate dielectric layer 308 and a gate conductive layer 312. ReRAM cell 309 includes variable resistance layers 310 and top electrode 314. For purposes of this disclosure, the top electrode may be referred to as conductive layers, second conductive layers, or second electrodes to distinguish them from another electrode of ReRAM cell 309. ReRAM cell also includes a bottom electrode, which may be also referred to as a conductive layer, a first conductive layer, or a first electrode. This bottom electrode is a part of drain region 306 of FET 303. Specifically, component 306 shown in FIG. 3 is configured to function as a drain region of FET 303 and as a bottom electrode of ReRAM cell 309. Furthermore, component 306 also functions as bottom electrodes of devices 313a-313c. For example, the bottom electrode of ReRAM cell 309 may be operable as a source region of a FET. Furthermore, the same FET may have a source region that is operable as a bottom electrode of one or more cells, or may have a drain region that is operable as a bottom electrode of one or more cells as, for example, shown in FIG. 4.

FET 303 is configured to control the flow of the electrical current through ReRAM cell 309 during operation of the cell. Furthermore, FET 303 is configured to control the flow of the electrical current through devices 313a-313c. Specifically, the voltage between source region 304 and gate conductive layer 312 determines the level of current that can pass between source region 304 and drain region 306. This current may then pass through ReRAM cell 309 during reading or switching of ReRAM cell 309.

In some embodiments, ReRAM cell 309 and group of devices 313a-313c are not operated simultaneously. For example, ReRAM cell 309 may be read and/or switched while devices 313a-313c may be inactive during this operation. Alternatively, assembly 300 may be configured to allow reading and/or switching of ReRAM cell 309 and operating devices 313a-313c at the same time. Examples of devices 313a-313b include a pinched resistor, a bipolar junction transistor, a junction gate field-effect transistor, a silicon on insulator device, a fully depleted silicon on insulator device, a self-aligned double-gate MOSFET (FinFET) device, a diode, or an additional resistive-switching cell.

For example, when devices 313a-313c are additional resistive-switching cells, these cells as well as ReRAM cell 309 may be read and/or switched at the same time. This type of reading and/or switching may be performed without differentiating among the cells. As such, all cells may be treated as one group and their collective resistance characteristics are determined during reading or changed during switching. When four ReRAM cells are connected to the same FET, the reading response may be one of the following five options: (1) all cells have HRS, (2) one cell has LRS while three cells have HRS, (3) two cells have LRS while two cells have HRS, (4) three cells have LRS while one cell has HRS, and (5) all cells have LRS. While this number of possible options is less than that when each cells is addressed individually (i.e., $2^4$=16 different responses), sharing one FET among multiple cells may significantly simplify the design and fabrication of the overall memory assembly.

Components of ReRAM cell 309 will now be described in more detail. One having ordinary skill in the art would understand that this description is also applicable to other resistive-switching cells that may share the same drain region 306. ReRAM cell 309 includes a bottom electrode (i.e., a first conductive layer), which is also drain region 306 of FET 303. Furthermore, ReRAM cell 309 includes a top electrode 314 (i.e., a second conductive layer) and a variable resistance layer 310 disposed between the bottom electrode and top electrode 314. Top electrode 314 may directly interface or be electrically connected to signal line 316. Signal line 316 may be used to connect top electrode 314 to the control circuitry. For example, signal line 316 may be used to apply a desired potential to top electrode 314a during reading and/or switching of ReRAM cell 309. Signal line 316 may be shared by other cells. In some embodiments, top electrode 314 may be used as a signal. The bottom electrode and signal line 316 may extend substantially parallel to each other. Alternatively, the bottom electrode and signal line 316 may extend substantially perpendicular to each other.

Assembly 300 may include other signal lines for connecting other components of assembly 300 to the control circuitry. As shown in FIG. 3, signal line 316b may be connected to device 313a. Signal line 316c may be connected to device 313b, while signal line 316d may be connected to device 313c. Another signal line 316e may be connected to or may directly interface gate conductive layer 312 of FET 303, while signal line 316f may be connected to or may directly interface source region 304 of FET 303.

The bottom electrode of ReRAM cell 309, which is also drain region 306 or FET 303 and the bottom electrodes of devices 313a-313c, may include doped silicon. More specifically, n+ doped silicon or p+ doped silicon may be used. In some embodiments, the conductivity of the bottom electrode may be less than or equal to ⅓ of the conductivity of the signal line, e.g., the signal line connected to the top electrode. Because of this conductivity limitation, the size of the shared bottom electrode (i.e., drain region 306) may be limited such that the potential experienced by a bottom interface surface of each variable resistance layer is substantially the same (e.g., deviates by less than 0.1V during operation of the cells). This size restriction may allow only a limited number of cells to use the same drain region (or on the same source region) of the FET as their bottom electrodes. In some embodiments, a number of cells sharing a common bottom electrode that also functions as a source region or a drain region is less than or equal to 12, less than or equal to 8, or even less than or equal to 6. To accommodate this shared electrode function, the width of the variable resistance layer may be less than 1/10 of the width of the shared bottom electrode. It should be noted that in conventional ReRAM cells, the width of the variable resistance layer is generally the same as the width of both electrodes. Furthermore, this difference in size between the variable resistance layer and the bottom electrode results in a control active area of each ReRAM cell, which is determined by the interface between the variable resistance layer and the bottom electrode and therefore is determined by the boundary of the variable resistance layer.

In some embodiments, the thickness of variable resistance layer 310 may be substantially the same as the thickness of gate dielectric layer 312 of FET 303. Furthermore, variable resistance layer 310 and gate dielectric layer 312 may be formed from the same starting material (e.g., hafnium oxide). This starting material may be modified to form variable resistance layer 310 and/or gate dielectric layer 312. While both variable resistance layer 310 and gate dielectric layer 312 are formed from dielectric materials, their characteristics may need to be different. For example, variable resistance layer 310 may need to have a higher leakage and lower breakdown voltage than gate dielectric 312. The leakage may be increased while the breakdown voltage may be decreased by, for example, doping a portion of the initial material corresponding to variable resistance layer 310, while the initial material corresponding to gate dielectric layer 312 may remain unchanged.

In some embodiments, top electrode 314 (i.e., the second conductive layer) of ReRAM cell 309 and gate conductive layer 312 of FET 303 may have the same composition. For example, both layers may be formed from titanium nitride.

In some embodiments, ReRAM cell 309 also includes a barrier layer disposed between the bottom electrode and variable resistance layer 310. The barrier layer may be used to prevent migration of materials between the bottom electrode and variable resistance layer 310. A similar barrier layer may be disposed between gate dielectric 308 and gate conductive layer 312 of FET 303.

In some embodiments, ReRAM cell 309 also includes an interface layer disposed between the bottom electrode and variable resistance layer 310. The interface layer may be formed from a silicon oxide. Alternatively, the bottom electrode may directly interface variable resistance layer 310.

Variable resistance layer 310 can be fabricated from a dielectric material, such as a metal oxide material or other similar material that can be switched between two or more stable resistive states. In some embodiments, variable resistance layer 310 is fabricated from a high bandgap material, e.g., a material that has a bandgap of at least about 4 electron Volts. Some examples of such materials include $HfO_2$, $Ta_2O_5$, or $Al_2O_3$, $Y_2O_3$, $ZrO_2$, non-stoichiometric variations thereof, or mixture thereof.

In some embodiments, variable resistance layer 310 includes a dopant that has an affinity for oxygen, such as various transition metals (e.g., aluminum, titanium, and zirconium), to form a metal-rich variable resistance layer, such as a non-stoichiometric oxide (e.g., $HfO_{1.5}$-$HfO_{1.9}$ or, more specifically, $HfO_{1.7}$). The dopant may be the same materials as a metal of the base oxide (e.g., $HfO_2$ doped with hafnium) or different (e.g., $HfO_2$ doped with aluminum, titanium, and zirconium). Oxygen deficiency of the metal-rich variable resistance layer corresponds to a number of oxygen vacancies, which are believed to be defects responsible for resistive switching. The amount of defects is controlled to achieve certain switching and forming voltages, operating currents, improve performance consistency and data retention.

Variable resistance layer 310 may have a thickness of between about 1 nm to about 100 nm, such as between about 2 nm and 20 nm or, more specifically, between about 5 nm and 10 nm. Thinner variable resistance layers may be deposited using ALD, while thicker variable resistance layers may be deposited using may be deposited using ALD as well as physical vapor deposition (PVD) and, in some embodiments, chemical vapor deposition (CVD).

Top electrode 314 may be fabricated from a conductive material that has a desirable conductivity and work function, such as p-type polysilicon, n-type polysilicon, transition metals, transition metal alloys, transition metal nitrides, or transition metal carbides. For example, electrode 314 may include one or more of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), or ruthenium (Ru). Electrode 314 may include titanium/aluminum alloy and/or a silicon-doped aluminum. In some embodiments, electrode 314 may be formed from titanium, tantalum, or aluminum. Electrode 314 may be between about 5 nm and about 500 nm thick or, more specifically, between about 10 nm and about 100 nm thick.

A brief description of FET 303 will now be provided to better illustrate various features of this disclosure. The references are made to negative metal-oxide semiconductor (NMOS) devices but other types of MOS devices are also within the scope and will be understood by one having ordinary skill in the art. FET 303 may include an n-doped substrate 301 and a p-doped well 302 disposed within substrate 301. Substrate 301 is typically a wafer or part of a wafer that may include other devices and components, such as other FETs and ReRAM cells.

N-doped substrate 301 may include any suitable p-type dopants, such as phosphorus and arsenic, and may be formed by any suitable technique. P-doped well 302 may include any suitable n-type dopants, such as boron and indium, and may be formed by any suitable technique. For example, p-doped well 302 may be formed by doping substrate 301 by ion implantation, for example.

FET 303 also includes gate conductive layer 312 that is separated from p-doped well 302 by gate dielectric layer 308. Gate conductive layer 312 may include any suitable conductive material, such as polysilicon with a p-type dopant, such as boron. Other materials are also within the scope. As noted above, gate conductive layer 312 may be made from the same material as top electrode 314.

Gate dielectric layer 308 may be formed from hafnium oxide or other suitable material. Hafnium oxide has a very high dielectric constant and a large conduction band offset with respect to silicon. In some embodiments, a work function modulation layer may be provided between gate dielectric 308 and gate conductive layer 312. The work function modulation layer may be made from aluminum, for example.

FET 303 also includes n-doped source region 304 and drain region 306. Source region 304 and drain region 306 are located on each side of gate electrode 308 forming a channel within p-doped well 302. Source region 304 and drain region 306 may be formed by ion implantation. Alternatively, a dopant maybe provided into source region 304 and drain region 306 during their deposition.

Processing Examples

Figure 5:
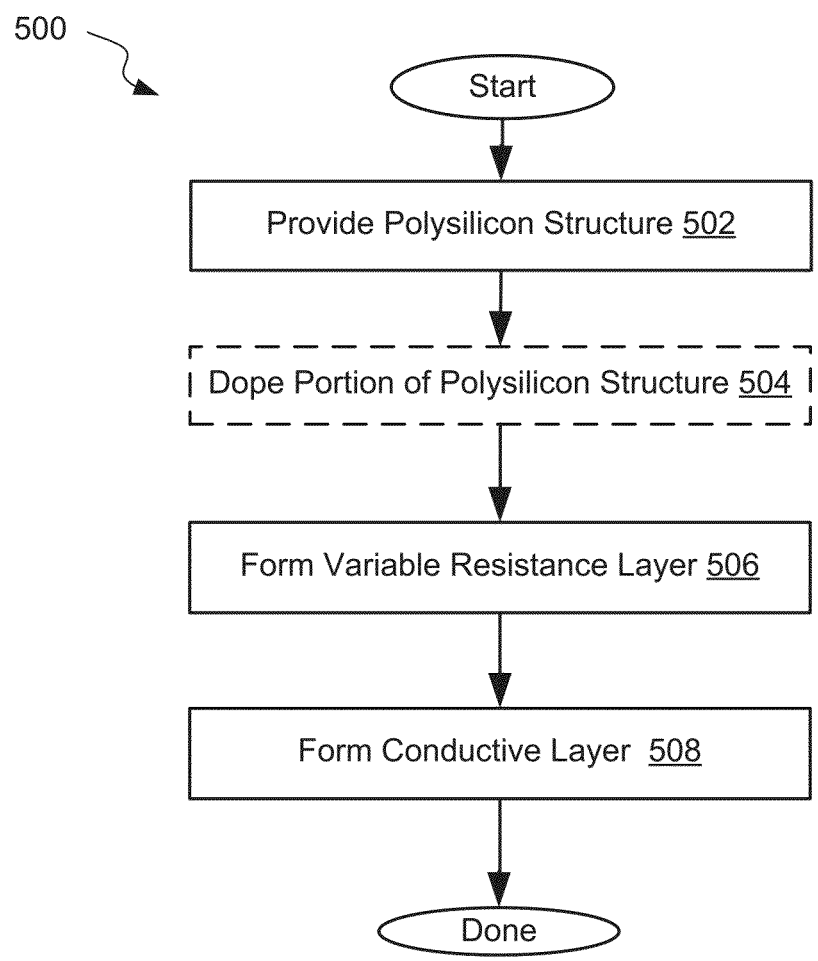
FIG. 5 illustrates a process flowchart corresponding to a method of forming a ReRAM cell having a bottom electrode that also functions as a drain region or a source region of a FET, in accordance with some embodiments.

FIG. 5 illustrates a process flowchart corresponding to a method 500 of forming a ReRAM cell, in accordance with some embodiments. Method 500 may commence with providing a polysilicon structure during operation 502 and doping a portion of the polysilicon structure with an n-type dopant or a p-type dopant during operation 504. The doping may be performed using ion implantation. This doping technique will be understood by one having ordinary skills in the art. In some embodiments, a polysilicon structure is doped during deposition and operation 504 is omitted. After operation 504, bottom electrodes of multiple ReRAM cells and a source region or a drain region of a FET is formed.

Method 400 may proceed with forming a variable resistance layer on the doped portion of the polysilicon structure during operation 506. The variable resistance layer may be deposited using PVD or other suitable techniques. For example, a hafnium oxide layer having a thickness of between about 0.5-50 nm may be formed using reactive sputtering of a metal hafnium target in a 20-60% oxygen atmosphere. Power of 100-1000 Watts (W) may be used on a 50-75 mm diameter target (e.g., power densities of 2-50 W/cm$^2$) to achieve deposition rates of between about 0.01 and 0.1 nm per second. These process parameters are provided as examples and generally depend on deposited materials, tools, deposition rates, and other factors. Other processing techniques, such as ALD, PLD, CVD, evaporation, and the like can also be used to deposit the variable resistance layer. For example, ALD can be used to form a hafnium oxide layer using hafnium precursors, such as tetrakis(diethylamido)hafnium (TDEAHf), tetrakis(dimethylamido)hafnium (TDMAHf), tetrakis(ethylmethylamido)hafnium (TEMAHf) or hafnium chloride (HfCl$_4$), and a suitable oxidant, such as water, oxygen plasma, or ozone.

A variable resistance layer may include multiple metals. For example, one metal may be used to dope an oxide of another metal. Two or more metals may be co-deposited to form one common layer or deposited in sequences to form multiple sub-layers of the variable resistance layer. For example, PVD may be used to deposit a layer containing hafnium oxide and aluminum oxide. Specifically, a co-sputtering arrangement using either a hafnium target and an aluminum target in an oxygen containing atmosphere or a hafnium oxide target and an aluminum oxide target may be used. In another example, ALD may be used to co-inject hafnium and aluminum precursors at desired proportions to co-deposit a metal oxide layer or to form multiple sub-layers. In some embodiments, operation 404 may involve ion implantation. The ion implantation can isovalently or aliovalently dope the variable resistance layer and can reduce forming voltages, improve set and reset voltage distributions, and increase device yield.

In some embodiments, the doped portion of the polysilicon structure extends beyond the variable resistance layer. The doped portion may be operable as a bottom electrode of the ReRAM cell and as an electrode of at least another ReRAM cell. The doped portion is also operable as a source region or a drain region of a FET, which is configured to control a flow of an electrical current through the ReRAM cell and at least one other device.

Method 500 may proceed with forming a conductive layer over the variable resistance layer during operation 508. The conductive layer is operable as a second electrode. For example, a titanium nitride electrode using sputtering. Deposition of the titanium nitride electrode may be performed using a titanium target in a nitrogen atmosphere maintained at a pressure of between about 1-20 mTorr. The power density may be maintained at 3.3-11 W/cm$^2$ (150-500 Watts on a 3" diameter target) that may result in a deposition rate of about 0.05-0.5 nm per second (depending on the size of the target sample and other process parameters). Some of the provided process parameters are for illustrative purposes only and generally depend on deposited materials, tools, deposition rates, and other factors.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A resistive random access memory (ReRAM) cell comprising: a first conductive layer; a second conductive layer; and a variable resistance layer;
   wherein the first conductive layer and the second conductive layer are operable as electrodes of the ReRAM cell,
   wherein the variable resistance layer is disposed between the first conductive layer and the second conductive layer;
   wherein the first conductive layer comprises doped silicon; and
   the first conductive layer being operable as an electrode of at least one other device, wherein the first conductive layer is operable as a source or a drain region of a field effect transistor (FET) configured to control a flow of an electrical current through the ReRAM cell, and wherein the FET is one of the two other devices, and
   wherein a thickness of the variable resistance layer is substantially the same as a thickness of a gate dielectric of the FET,
   wherein the first conductive layer is operable as a bottom electrode of one or more additional devices different from the FET,
   wherein the one or more additional devices comprise at least one of a pinched resistor, a bipolar junction transistor, a junction gate field-effect transistor, a silicon on insulator device, a fully depleted silicon on insulator device, a self-aligned double-gate MOSFET (FinFET) device, a diode, or an additional ReRAM cell.

2. The ReRAM cell of claim 1, wherein the first conductive layer comprises one of n+ doped silicon and p+ doped silicon.

3. The ReRAM cell of claim 1, wherein the second conductive layer of the ReRAM cell and a gate conductive layer of the FET have the same composition.

4. The ReRAM cell of claim 1, wherein a width of the variable resistance layer is at least about 10 times less than a width of the first conductive layer.

5. The ReRAM cell of claim 1, further comprising a signal line, wherein the second conductive layer is disposed between the signal line and the variable resistance layer.

6. The ReRAM cell of claim 5, wherein a conductivity of the first conductive layer is at least about three times less than a conductivity of the signal line.

7. The ReRAM cell of claim 5, wherein the first conductive layer and the signal line extend substantially parallel to each other.

8. The ReRAM cell of claim 5, wherein the first conductive layer and the signal line extend substantially perpendicular to each other.

9. The ReRAM cell of claim 1, further comprising a barrier layer disposed between the first conductive layer and the variable resistance layer.

10. The ReRAM cell of claim 1, further comprising an interface layer disposed between the first conductive layer and the variable resistance layer.

11. The ReRAM cell of claim 10, wherein the interface layer comprises a silicon oxide.

12. The ReRAM cell of claim 1, wherein the variable resistance layer comprises one of $HfO_2$, $Ta_2O_5$, or $Al_2O_3$, $Y_2O_3$, or $ZrO_2$.

13. The ReRAM cell of claim 1, wherein the second conductive layer comprises titanium nitride.

14. The ReRAM cell of claim 1, wherein the first conductive layer directly interfaces the variable resistance layer.

15. The ReRAM cell of claim 1, wherein the second conductive layer directly interfaces the variable resistance layer.

16. A resistive random access memory (ReRAM) cell comprising: a first conductive layer comprising titanium nitride; a second conductive layer comprising n+ doped polysilicon; and a variable resistance layer comprising one of HfO2, Ta2Os, or Al2O3, Y2O3, or ZrO2, wherein the first conductive layer and the second conductive layer are operable as electrodes;
   wherein the variable resistance layer disposed between the first conductive layer and the second conductive layer; and
   the first conductive layer being operable as an conductive layer of at least one other device,
   wherein the first conductive layer is operable as a drain of a field effect transistor (FET) configured to control a flow of an electrical current through the ReRAM cell, and wherein the FET is one of the two other devices, and
   wherein a thickness of the variable resistance layer is substantially the same as a thickness of a Rate dielectric of the FET,
   wherein the first conductive layer is operable as a bottom electrode of one or more additional devices different from the FET,
   wherein the one or more additional devices comprise at least one of a pinched resistor, a bipolar junction transistor, a junction gate field-effect transistor, a silicon on insulator device, a fully depleted silicon on insulator device, a self-aligned double-gate MOSFET (FinFET) device, a diode, or an additional ReRAM cell.

17. The ReRAM cell of claim 16, wherein the one or more additional devices comprise the additional ReRAM cell.

18. The ReRAM cell of claim 1, wherein the gate dielectric of the FET comprises hafnium oxide.

* * * * *